United States Patent [19]

Khudoshin

[11] Patent Number: 5,734,289
[45] Date of Patent: Mar. 31, 1998

[54] CIRCUIT ARRANGEMENT FOR CONTROLLING A TRIAC

[75] Inventor: Alexander Khudoshin, North Sydney, Australia

[73] Assignee: U. S. Philips Corporation, New York, N.Y.

[21] Appl. No.: 623,387

[22] Filed: Mar. 27, 1996

[30] Foreign Application Priority Data

Mar. 31, 1995 [AU] Australia ............... PN 2082

[51] Int. Cl.$^6$ ............................................. H03K 17/72
[52] U.S. Cl. ............................. 327/438; 327/446
[58] Field of Search ................. 307/130; 327/74, 327/76, 77, 78, 79, 438, 445, 446, 451

[56] References Cited

U.S. PATENT DOCUMENTS

| | | | |
|---|---|---|---|
| 4,334,183 | 6/1982 | Hauenstein | 323/235 |
| 4,546,239 | 10/1985 | Sugimori | 327/451 |
| 4,737,671 | 4/1988 | Nutz et al. | 307/632 |
| 5,629,571 | 5/1997 | Roudeski | 327/438 |

*Primary Examiner*—Timothy P. Callahan
*Assistant Examiner*—Jeffrey Zweizig
*Attorney, Agent, or Firm*—Steven R. Biren

[57] ABSTRACT

Circuit arrangement for controlling a triac.

Triac control circuit with a mechanism (6) for sensing the gate voltage of a triac (2) and a gate pulse generator (11) responsive to the means for sensing. The gate voltage depends on the current through the triac and changes from a higher voltage value for a large triac current to a lower voltage value for a triac current closer to the triac holding current. By sensing the gate voltage it is possible to anticipate the triac turnoff and to generate a triac gate pulse before the triac turns off.

14 Claims, 1 Drawing Sheet

CIRCUIT ARRANGEMENT FOR CONTROLLING A TRIAC

BACKGROUND OF THE INVENTION

The present invention relates to a circuit arrangement for controlling an alternating current through a triac.

It is known to use triac circuit arrangements for controlling AC power through a load. In these triac circuit arrangements the load is coupled to the triac and the AC power through the load is controlled by switching the triac on and off. Normally a triac will automatically turn off when the alternating current through it approaches zero. However, by supplying a pulse to the triac's gate during the zero crossing the triac will be turned on for the following half cycle. In order to determine when to fire the triac gate pulse it is known for these triac circuit arrangements to use zero voltage crossing detectors. These zero crossing detectors sense the mains voltage or the voltage on the triac terminal MT2 in order to determine when to fire the triac. Where the load is resistive the mains voltage is usually sensed. Resistive loads have a load current which is in phase with the alternating supply voltage, thus the supply voltage can be used to sense the zero-crossing of the load and triac current.

With reactive loads the current through the load is out of phase with the voltage and sensing the mains voltage for zero crossing firing is impractical. This is because the mains voltage, having a different phase to the current, does not provide zero crossing information for that current. With reactive loads it is known to monitor the MT2 terminal of the triac so as to detect when the triac has been turned off in order to generate a triac gate pulse to turn the triac on for the following half cycle. As triac gate pulses are generated only after the triac has turned off, the voltage transients cause high level of radio frequency interference.

SUMMARY OF THE INVENTION

The object of the invention is to provide a new circuit arrangement for controlling a triac and which also minimizes the above disadvantage.

To this end the invention comprises a circuit arrangement for controlling an alternating current through a triac comprising, a triac having a gate terminal and first and second terminals through which an alternating current is supplied, a threshold detector coupled to the gate terminal of the triac, the threshold detector outputting a signal when the voltage on the gate terminal of the triac is between two predetermined thresholds of opposite polarities, a pulse generator coupled to the threshold detector, the pulse generator adapted to supply a triac gate pulse to the gate terminal of the triac in response to said signal from the threshold detector, whereby triac gate pulses are supplied during zero crossings of the alternating current through the first and second terminals of the triac.

The present invention is based on the discovery made by the inventor that after the triac gate pulse has ended, the gate voltage of a triac depends on the MT2 current. The triac gate voltage was found to change from a higher voltage value for a large triac current to a lower voltage value for a triac current closer to the triac holding current. Thus, by sensing the triac gate voltage it was found to be possible to anticipate when the triac will turn off and generate the triac gate pulse before the triac turns off. In the present invention this is achieved by choosing a suitable threshold level for the triac gate voltage. Once the triac gate voltage falls below this threshold level a triac gate pulse is generated. As the circuit arrangement in accordance with invention actually senses the load current it can be successfully used with both resistive and reactive loads.

In a preferred embodiment of the invention the circuit arrangement further comprises a control means for supplying a first signal to the pulse generator, in response to which the pulse generator switches off the triac gate pulses.

In a further preferred embodiment of the invention the circuit arrangement comprises a zero voltage crossing detector for supplying zero crossing signals to the pulse generator, and the control means is adapted to supply a second signal to the pulse generator, in response to which the pulse generator supplies a triac gate pulse upon receipt of the next zero crossing signal.

Another object of the invention is to provide a circuit for use in such a circuit arrangement. To this end the invention further comprises a circuit for controlling an alternating current through a triac having a gate terminal and first and second terminals through which an alternating current is supplied, the circuit comprising;

a threshold detector adapted to be coupled to the gate terminal of the triac, the threshold detector adapted to output a signal when the voltage on the gate terminal of the triac is between two predetermined thresholds of opposite polarities, a pulse generator coupled to the threshold detector, the pulse generator adapted to supply a triac gate pulse to the gate terminal of the triac in response to said signal from the threshold detector, whereby triac gate pulses are supplied during zero crossings of the alternating current through the first and second terminals of the triac. Such a circuit may be in the form of an integrated circuit adapted to be coupled to the gate terminal of a triac.

BRIEF DESCRIPTION OF THE DRAWING

An embodiment of the invention is described in detail with reference to FIGS. 1 and 2, in which.

DESCRIPTION OF THE PREFERRED EMBODIMENTS

Figure 1:
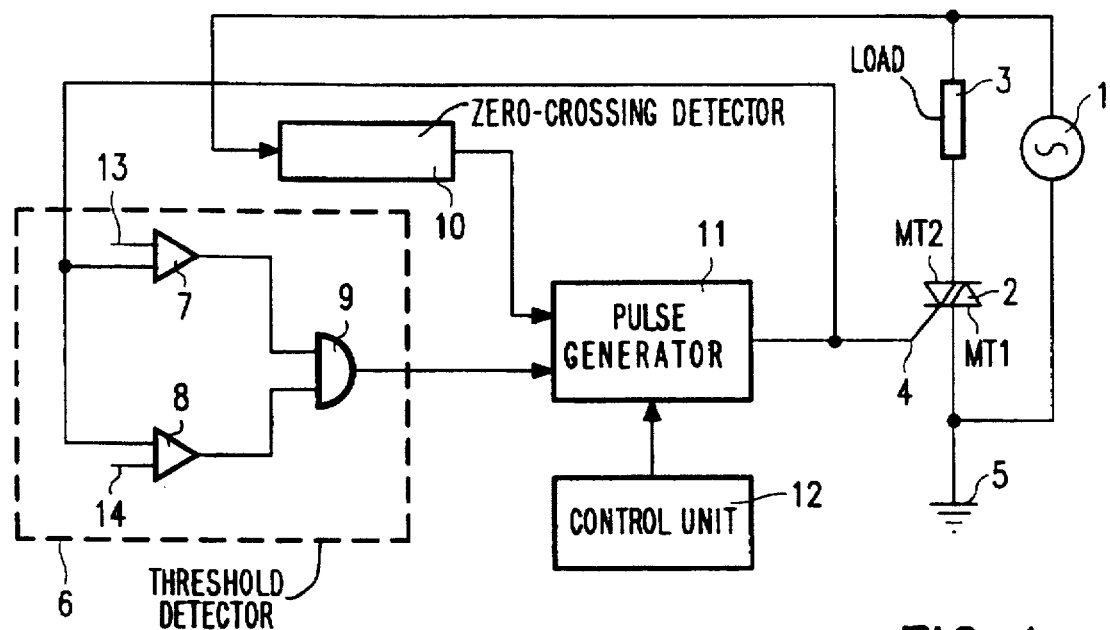
FIG. 1 is a block schematic diagram of a circuit arrangement according to the invention.

FIG. 1 shows a circuit arrangement for controlling a triac. The circuit arrangement includes an AC supply unit 1 across which a load 3 and a triac 2 are connected. The triac 2 has two main terminals MT1 and MT2 across which the alternating current potential is applied. The terminals MT1 and MT2 of the triac 2 are connected to an AC supply voltage reference point 5 and the load 3 respectively. The triac also has a gate terminal 4 for controlling the switching of the triac. It is the gate voltage on the gate terminal 4 relative to the voltage on MT1 that is sensed and used for controlling the triac. The circuit arrangement also comprises a threshold detector 6 which preferably includes comparators 7 and 8 and an AND gate 9. The comparators 7 and 8 have inputs connected to the gate terminal 4 of the triac 2 for sensing the triac gate voltage. The other input 13 of comparator 7 is connected to a positive threshold voltage V+, whereas the other input 14 of comparator 8 is connected to a negative threshold voltage V−. The outputs of the comparators 7 and 8 are connected to an AND gate 9 which in turn is connected to a pulse generator 11. The output of AND gate 9 goes TRUE when the triac gate voltage is negative relative to the positive threshold voltage V+ and positive relative to the negative threshold voltage V−. The output of the AND gate 9 goes FALSE when the triac gate voltage is positive relative to the positive threshold voltage or negative relative to the negative threshold voltage. The threshold detector 6 may take the form of any known threshold detector. In particular the threshold detection may be performed as in Australian Patent 602.444.

The output of the pulse generator 11 is connected to the gate terminal 4 for supplying gate pulses to the triac 2. The pulse generator 11 when in an ON state, supplies these triac gate pulses in response to the input signal from the AND gate 9 going TRUE.

The pulse generator 11 is also coupled to a controller 12. The form of the controller 12 depends on the application of the triac circuit arrangement. The triac circuit arrangement may be used in many different applications, for example heating systems, humidifiers, refrigerators etc. For the purposes of this embodiment the application is a cooling system and the controller 12 is a temperature sensor circuit and the load 3 is a cooling motor. If the temperature sensed by the temperature sensor circuit 12 is below a desired level then the temperature sensor circuit 12 will supply an OFF signal to the pulse generator. The OFF signal will switch the pulse generator to an OFF state and no triac gate pulses will be generated regardless of the input from the AND gate 9. Thus the triac 2 will be switched off and no power will be delivered to the load 3 (cooling fan motor).

In order to switch on the triac 2 after it has been off a zero voltage, a detector 10 is provided. The input of this zero voltage detector 10 is connected to the AC supply unit 1 and load 3. And the output of the zero voltage detector circuit 10 is connected to an input of the pulse generator circuit 11. The zero crossing detector 10 senses the mains supply voltage and supplies a zero crossing signal to the pulse generator 11 when the mains voltage crosses zero. When the pulse generator 11 is in an OFF state and receives a ON signal from the control means 12, the pulse generator will generate a triac gate pulse upon receipt of the next zero crossing signal from the zero voltage detector 10. The zero voltage detector circuit 10 can be any known zero voltage detector circuit.

Figure 2A:
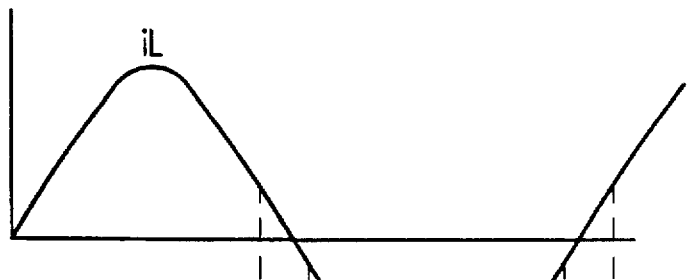
FIG. 2 shows waveforms related to the operation of the circuit arrangement of FIG. 1.
Figure 2B:
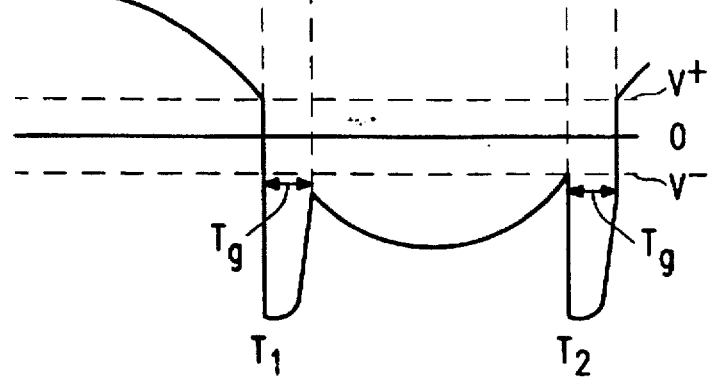

Reference is made to FIGS. 2a and 2b in describing the operation of the circuit arrangement shown in FIG. 1. FIG. 2a shows the AC supply unit alternating current iL across the load 3. FIG. 2b shows the triac gate voltage on the gate terminal 4. As the alternating current iL in the first half cycle approaches zero, the voltage on the gate terminal 4 approaches the threshold voltage V+. At instant T1, the triac gate voltage falls below the threshold voltage V+ and the pulse generator 11 (when in the ON state) generates a triac gate pulse which has a duration Tg. The triac gate pulse is fed to the triac 2 and will turn on the triac 2 for the following half cycle of the alternating current iL. The gate pulse duration Tg is selected such that at the end of the triac gate pulse the alternating current iL exceeds the triac latching current. A similar situation occurs in the next half cycle, except that the triac gate pulse is generated at T2 once the triac gate voltage goes above the threshold voltage V−. A suitable threshold level is approximately ±200 mV for the majority of triacs but this can be varied to suit the application. For Thomson BW snubberless triacs the optimal positive threshold level is 450–500 mV. In some triacs the positive and negative threshold levels need not be symmetric.

From reading the present disclosure, other variations will be apparent to persons skilled in the art. Such variations may involve other features which are already known in circuit arrangements for controlling triacs and which may be used instead of or in addition to features already described herein.

What is claimed is:

1. A circuit arrangement for controlling an alternating current through a triac comprising:

a triac having a gate terminal and first and second terminals through which an alternating current is supplied;

a threshold detector coupled to the gate terminal of the triac, the threshold detector outputting a signal when the voltage on the gate terminal of the triac is between two predetermined thresholds of opposite polarities; and a pulse generator coupled to the threshold detector, the pulse generator adapted to supply a triac gate pulse to the gate terminal of the triac in response to said signal from the threshold detector, such that triac gate pulses are supplied during zero crossings of the alternating current through the first and second terminals of the triac.

2. A circuit arrangement as claimed in claim 1, wherein the predetermined thresholds of opposite polarity are symmetric.

3. A circuit arrangement as claimed in claim 1, wherein the predetermined thresholds of opposite polarity are non-symmetric.

4. A circuit arrangement as claimed in claim 1, the circuit arrangement further comprising control means for supplying a first signal to the pulse generator, in response to which the pulse generator switches off the triac gate pulses.

5. A circuit arrangement as claimed in claim 2, the circuit arrangement further comprising control means for supplying a first signal to the pulse generator, in response to which the pulse generator switches off the triac gate pulses.

6. A circuit arrangement as claimed in claim 3, the circuit arrangement further comprising control means for supplying a first signal to the pulse generator, in response to which the pulse generator switches off the triac gate pulses.

7. A circuit arrangement as claimed in claim 4, the circuit arrangement further comprises:

a zero voltage crossing detector for supplying zero crossing signals to the pulse generator; and whereas the control means is adapted to supply a second signal to the pulse generator, in response to which the pulse generator supplies a triac gate pulse upon receipt of the next zero crossing signal.

8. A circuit for controlling an alternating current through a triac having a gate terminal and first and second terminals through which an alternating current is supplied, the circuit comprising:

a threshold detector adapted to be coupled to the gate terminal of the triac, the threshold detector adapted to output a signal when the voltage on the gate terminal of the triac is between two predetermined thresholds of opposite polarities; and a pulse generator coupled to the threshold detector, the pulse generator adapted to supply a triac gate pulse to the gate terminal of the triac in response to said signal from the threshold detector, such that triac gate pulses are supplied during zero crossings of the alternating current through the first and second terminals of the triac.

9. A circuit as claimed in claim 8, wherein the predetermined thresholds of opposite polarity are symmetric.

10. A circuit as claimed in claim 8, wherein the predetermined thresholds of opposite polarity are non-symmetric.

11. A circuit as claimed in claim 8, the circuit further comprising control means for supplying a first signal to the pulse generator, in response to which the pulse generator switches off the triac gate pulses.

12. A circuit as claimed in claim 11, the circuit further comprising: a zero voltage crossing detector for supplying zero crossing signals to the pulse generator; and wherein: the control means is adapted to supply a second signal to the pulse generator, in response to which the pulse generator supplies a triac gate pulse upon receipt of the next zero crossing signal.

13. A circuit as claimed in claim 9, the circuit further comprising control means for supplying a first signal to the pulse generator, in response to which the pulse generator switches off the triac gate pulses.

14. A circuit as claimed in claim 10, the circuit further comprising control means for supplying a first signal to the pulse generator, in response to which the pulse generator switches off the triac gate pulses.

* * * * *